US011658593B2

(12) United States Patent          (10) Patent No.: US 11,658,593 B2
Curtis                                                (45) Date of Patent:      *May 23, 2023

(54) AUTOMATED SPEED RAMP CONTROL OF STEPPER MOTORS

(71) Applicant: Microchip Technology Incorporated, Chandler, AZ (US)

(72) Inventor: Keith Edwin Curtis, Queen Creek, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/731,884

(22) Filed: Apr. 28, 2022

(65) Prior Publication Data

US 2022/0329182 A1     Oct. 13, 2022

Related U.S. Application Data

(63) Continuation of application No. 16/254,797, filed on Jan. 23, 2019, now Pat. No. 11,323,052.

(Continued)

(51) Int. Cl.
*H02P 8/00*          (2006.01)
*H02P 8/14*          (2006.01)
*G05B 19/416*       (2006.01)

(52) U.S. Cl.
CPC ............. *H02P 8/14* (2013.01); *G05B 19/416* (2013.01); *G05B 2219/33088* (2013.01); *G05B 2219/43139* (2013.01)

(58) Field of Classification Search
CPC .................. G05B 19/40; G05B 19/416; G05B 2219/33088; G05B 2219/43139; H02P 8/14; H03K 7/08

(Continued)

(56) References Cited

U.S. PATENT DOCUMENTS 5,574,575 A * 11/1996 Kato .................. H04N 1/32448
                                                              358/401
6,548,796 B1 * 4/2003 Silvermintz ....... G02B 21/0024
                                                              250/201.3

(Continued)

FOREIGN PATENT DOCUMENTS

DE        102016013617 A1     5/2017           G05B 19/414

OTHER PUBLICATIONS

Feng, Qian et al., "FPGA-Based Acceleration and Deceleration Control for CNC Machine Tools," International Conference on Mechatronic Sciences, Electric Engineering and Computer (MEC), pp. 210-214, , dated Dec. 1, 2013.

(Continued)

*Primary Examiner* — Kawing Chan
*Assistant Examiner* — Gabriel Agared
(74) *Attorney, Agent, or Firm* — Slayden Grubert Beard PLLC (57) ABSTRACT

Automated speed ramp control of stepper motor acceleration and deceleration using direct memory access (DMA) and core independent peripherals (CIPs) comprises a numerically controlled oscillator (NCO) controlled through direct memory access (DMA) transfers of prescale values used in combination with a clock oscillator to generate clock pulses that are a function of the clock oscillator frequency and the prescale values. This automates changing the frequency of the NCO, thereby controlling steeper motor speed, without requiring computer processing unit (CPU) overhead. The DMA module is enabled during a first number of clock pulses for step speed acceleration, disabled during a second number of clock pulses for normal operation at full step speed, and then re-enabled during a third number of clock pulses for step speed deceleration. A table in memory may (Continued)

store and provide a plurality of acceleration and deceleration prescale values for DMA transfers to the NCO.

18 Claims, 6 Drawing Sheets

Related U.S. Application Data (60) Provisional application No. 62/750,434, filed on Oct. 25, 2018.

(58) Field of Classification Search
USPC .......................................................... 318/696
See application file for complete search history.

(56) References Cited

U.S. PATENT DOCUMENTS

| | | | |
|---|---|---|---|
| 10,114,359 B2 | 10/2018 | Hada et al. | |
| 2007/0150423 A1* | 6/2007 | Kirschner | G07B 17/00508 |
| | | | 705/408 |
| 2007/0198101 A1* | 8/2007 | Leung | H02P 8/16 |
| | | | 700/32 |
| 2008/0012523 A1* | 1/2008 | Kobayashi | G05B 19/40 |
| | | | 399/167 |
| 2013/0015798 A1* | 1/2013 | Wright | H03K 7/08 |
| | | | 323/241 |
| 2017/0163190 A1* | 6/2017 | Curtis | H02P 8/40 |

OTHER PUBLICATIONS

International Search Report and Written Opinion, Application No. PCT/US2019/038110, 14 pages, dated Oct. 22, 2019.

* cited by examiner

AUTOMATED SPEED RAMP CONTROL OF STEPPER MOTORS

RELATED PATENT APPLICATION

This application claims priority to commonly owned U.S. Provisional Patent Application Ser. No. 62/750,434; filed Oct. 25, 2018; entitled "Automated Speed Ramp Control for Stepper Motors," and U.S. Non-Provisional patent application Ser. No. 16/254,797 filed Jan. 23, 2019 entitled "Automated Speed Ramp Control Of Stepper Motors" by Keith Edwin Curtis; and are hereby incorporated by reference herein for all purposes.

TECHNICAL FIELD

The present disclosure relates to speed control for stepper motors and, more particularly, to a method and apparatus for automated speed ramp control of stepper motors.

BACKGROUND

Stepper motors are synchronous positioning motors. To run at high step rates the stepper motor must be accelerated and decelerated (step speed ramp control) to retain lock. By using a numerically controlled oscillator (NCO) based stepper circuit the step speed sequencing may be automated. However, this requires software overhead to accelerate and decelerate the stepper motor(s). When the stepper motor speed is increased or decreased, software running on a central processing unit (CPU) of a microcomputer or microcontroller must provide new prescaler NCO values and load them into the prescaler NCO. This requires a high priority interrupt to the CPU, thereby reducing performance of other software related functions.

SUMMARY

Therefore, what is needed is an automated stepper motor acceleration and deceleration (speed ramp control) method and apparatus using direct memory access (DMA) to reduce the core processing, e.g., central processing unit (CPU), loading and improve software instruction execution timing thereof.

According to an embodiment, a method for speed ramp control of a stepper motor using direct memory access (DMA) transfers may comprise the steps of: providing a numerically controlled oscillator (NCO) having oscillator and prescale value inputs and an output providing clock pulses, wherein a frequency of the clock pulses may be a function of the oscillator frequency and the prescale value; providing a table of acceleration and deceleration prescale values in a memory; programming the NCO with the acceleration prescale values from the memory using direct memory access (DMA) transfers for a first number of clock pulses; inhibiting DMA transfers to the NCO for a second number of clock pulses; and programming the NCO with the deceleration prescale values from the memory using the DMA transfers for a third number of clock pulses.

According to a further embodiment of the method, may comprise the step of counting a certain number of clock pulses from the NCO before doing the DMA transfer to the NCO. According to a further embodiment of the method, may comprise the step of counting the number of clock pulses from the NCO then inhibiting the output of the NCO after the number of clock pulses reaches a maximum count.

According to another embodiment, an apparatus for automated speed ramp control of stepper motor acceleration and deceleration may comprise: an oscillator having an output; a numerically controlled oscillator (NCO) having oscillator and prescale value inputs and an output providing clock pulses, wherein the NCO oscillator input may be coupled to the oscillator output and a frequency of the clock pulses from the NCO may be a function of a frequency from the oscillator and the prescale value; a memory for storing a plurality of acceleration and deceleration prescale values; and a direct memory access (DMA) control circuit coupled between the NCO prescale value input and the memory, and the output of the NCO, wherein the DMA control circuit may provide the NCO with the acceleration prescale values from the memory for a first number of clock pulses, inhibits the DMA control circuit for a second number of clock pulses, and then may provide the NCO with the deceleration prescale values from the memory for a third number of clock pulses.

According to a further embodiment, an accumulator counter may be coupled between the output of the NCO and the DMA control circuit, wherein the DMA control circuit may provide a single prescale value to the NCO after a certain number of clock pulses have occurred. According to a further embodiment a maximum counter may be coupled to the output of the NCO and inhibiting operation of the NCO after receiving a certain maximum number of clock pulses therefrom.

According to a further embodiment, the DMA control circuit may comprise: a pulse width modulation (PWM) module having an input coupled to the clock output of the NCO and an output; and a data signal modulator (DSM) having a first input coupled to the clock output of the NCO, a second input coupled to a fixed logic level, an output coupled to a DMA trigger input of the DMA module and a control input coupled to the PWM module output for selectively coupling the output of the DSM between the first and second inputs thereof, wherein the first input may be selected when the output of the PWM module may be at a first logic level and the second input may be selected when the output of the PWM module may be at a second logic level.

According to a further embodiment, an accumulator counter may be coupled between the output of the NCO, and the first input of the DSM and the input of the PWM module, wherein the DMA module may provide a single prescale value to the NCO after a certain number of clock pulses have occurred. According to a further embodiment, a duty cycle of the PWM module may be programmable to provide the first logic level output during the first number of clock pulses, the second logic level output during the second number of clock pulses, and the first logic level output during the third number of clock pulses. According to a further embodiment, the first logic level may be a logic zero and the second logic level may be a logic one. According to a further embodiment, the first logic level may be a logic one and the second logic level may be a logic zero. According to a further embodiment, the output of the DSM may be configured to switch between the first and second inputs thereof on an edge of a control signal to the control input of the DSM.

According to a further embodiment, the DMA control circuit may comprise: a first counter for counting the first number of clock pulses; a second counter for counting the second number of clock pulses; a third counter for counting the third number of clock pulses; and a multiplexer having a first input coupled to the NCO output, a second input coupled to a fixed logic level, an output coupled to the DMA module and input selection controlled by the first, second and third counters; wherein the first counter controls the multiplexer to couple the first input to the output thereof during the first number of clock pulses, the second counter controls the multiplexer to couple the second input to the output thereof during the second number of clock pulses, and the third counter controls the multiplexer to couple the first input to the output thereof during the third number of clock pulses.

According to yet another embodiment, an apparatus for automated speed ramp control of stepper motor acceleration and deceleration may comprise: an oscillator having an output; a numerically controlled oscillator (NCO) having oscillator and prescale value inputs and an output providing clock pulses, wherein the NCO oscillator input may be coupled to the oscillator output and a frequency of the clock pulses may be a function of a frequency from the oscillator and the prescale value; a memory for storing a plurality of acceleration and deceleration prescale values; a direct memory access (DMA) module coupled between the NCO prescale value input and the memory; a pulse width modulation (PWM) module having an input coupled to the clock output of the NCO; and a data signal modulator (DSM) having a first input coupled to the clock output of the NCO, a second input coupled to a fixed logic level, an output coupled to a DMA trigger input of the DMA module and a control input for selectively coupling the output of the DSM between the first and second inputs thereof; wherein the DMA module programs the NCO with the acceleration prescale values during a first number of clock pulses, does no programming of the NCO during a second number of clock pulses, and programs the NCO with the deceleration prescale values during a third number of clock pulses.

According to a further embodiment, an accumulator counter may be coupled between the clock output of the NCO, and the first input of the DSM and the input of the PWM module, wherein the DMA module may provide a single prescale value to the NCO after a certain number of clock pulses have occurred. According to a further embodiment, a maximum counter may be coupled to the output of the NCO and inhibiting operation of the NCO after receiving a certain maximum number of clock pulses therefrom. According to a further embodiment, a duty cycle of the PWM module may be programmable to provide the first logic level output during the first number of clock pulses, the second logic level output during the second number of clock pulses, and the first logic level output during the third number of clock pulses. According to a further embodiment, the output of the DSM may be configured to switch between the first and second inputs thereof on an edge of a control signal to the control input of the DSM.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

Embodiments of the present disclosure may provide automated speed ramp control for acceleration and deceleration of stepper motors using direct memory access (DMA) transfers to load the speed ramp control values without requiring intervention or program execution by an integrated circuit digital processor, e.g., central processing unit (CPU) of, for example but not limited to, a microcontroller unit (MCU) to maintain operation of acceleration and deceleration of the stepper motor(s). In addition, core independent peripherals (CIPs) may be used to facilitate the design of the automated stepper motor acceleration and deceleration (speed ramp control) circuit. CIPs are functional module blocks designed to handle their tasks with no software code or supervision from a CPU. Because the CIP functionality is performed in hardware instead of software, CIPs enable circuit performance that is far beyond the capabilities of typical microcontroller units (MCUs) while simplifying the design experience and reducing memory cost. Designers can create complex control circuits while having the flexibility to more easily innovate their embedded solutions. This functionality is especially advantage for use in computer numerical control (CNC) machines.

According to specific example embodiments of this disclosure, automated stepper motor acceleration and deceleration operational information (output clock frequency which determines the step speed) may be provided by a numerically controlled oscillator (NCO). The NCO is a timer that uses the overflow from the addition of an increment value to divide a signal having an input frequency by a divisor value to output a signal having a frequency of the input signal divided by the divisor value. The advantage of using this addition method over a simple counter driven timer or a pulse width modulator (PWM) is that the resolution of division does not vary with the divider value, thereby resulting in true linear frequency control. The NCO is most useful for applications that require linear frequency control, high frequency accuracy and fine resolution at a fixed duty cycle.

According to the teachings of this disclosure, the NCO may be configured as a frequency prescaler (hereinafter referred to as a "prescaler NCO") and having frequency prescale data provided through direct memory access (DMA) transfers without requiring intervention or program execution by the CPU of the MCU. This automates changing of the frequency prescale data into the prescaler NCO. A DMA control circuit may be used to control enabling and disabling DMA transfers, wherein DMA transfers are enabled during step speed acceleration and deceleration, and disabled during normal running step speed. A table in memory may be provided for step speed acceleration and deceleration frequency prescale data (determines clock frequencies—step speeds) whereby DMA suspension is all that is needed between the end of the step speed acceleration and the start of step speed deceleration to build a complete step speed acceleration/deceleration profile.

According to specific example embodiments of this disclosure, CPU program software intervention may be eliminated from the stepper motor acceleration and deceleration process. The acceleration/deceleration curve (determines clock pulse speed profile) may be loaded into a memory, and then stepper motor operation may be initiated. The circuit automatically ramps up (accelerates the step speeds) for a certain first number of NCO frequency cycles (clock pulses), then runs at the highest NCO frequency based upon the last frequency prescale data DMA transferred into the NCO during the acceleration phase for a certain second number of NCO frequency cycles, and then starts the deceleration phase (slows down step speed) for a certain third number of NCO frequency cycles. When the acceleration/deceleration curve has completed, the automated stepper motor acceleration and deceleration circuit may provide an interrupt to trigger software loading of the next stepper motor(s) movement curve (profile), e.g., from the CPU. An acceleration and deceleration curve (profile) is again started and the CNC machine continues operation.

An advantage of the automated stepper motor acceleration and deceleration circuit is that the acceleration and deceleration of the CNC clock is completely automated without intervention from the CPU of the CNC circuit.

An acceleration/deceleration table may be programmed into, for example but is not limited to, flash memory. A DMA CIP may be used to automate operation of the acceleration and deceleration circuit independent of CPU program steps. No program software (e.g., firmware) overhead other than the initial step frequency profile table loading, and a start operation are required.

Referring now to the drawings, the details of example embodiments are schematically illustrated. Like elements in the drawings will be represented by like numbers, and similar elements will be represented by like numbers with a different lower-case letter suffix.

Figure 1:
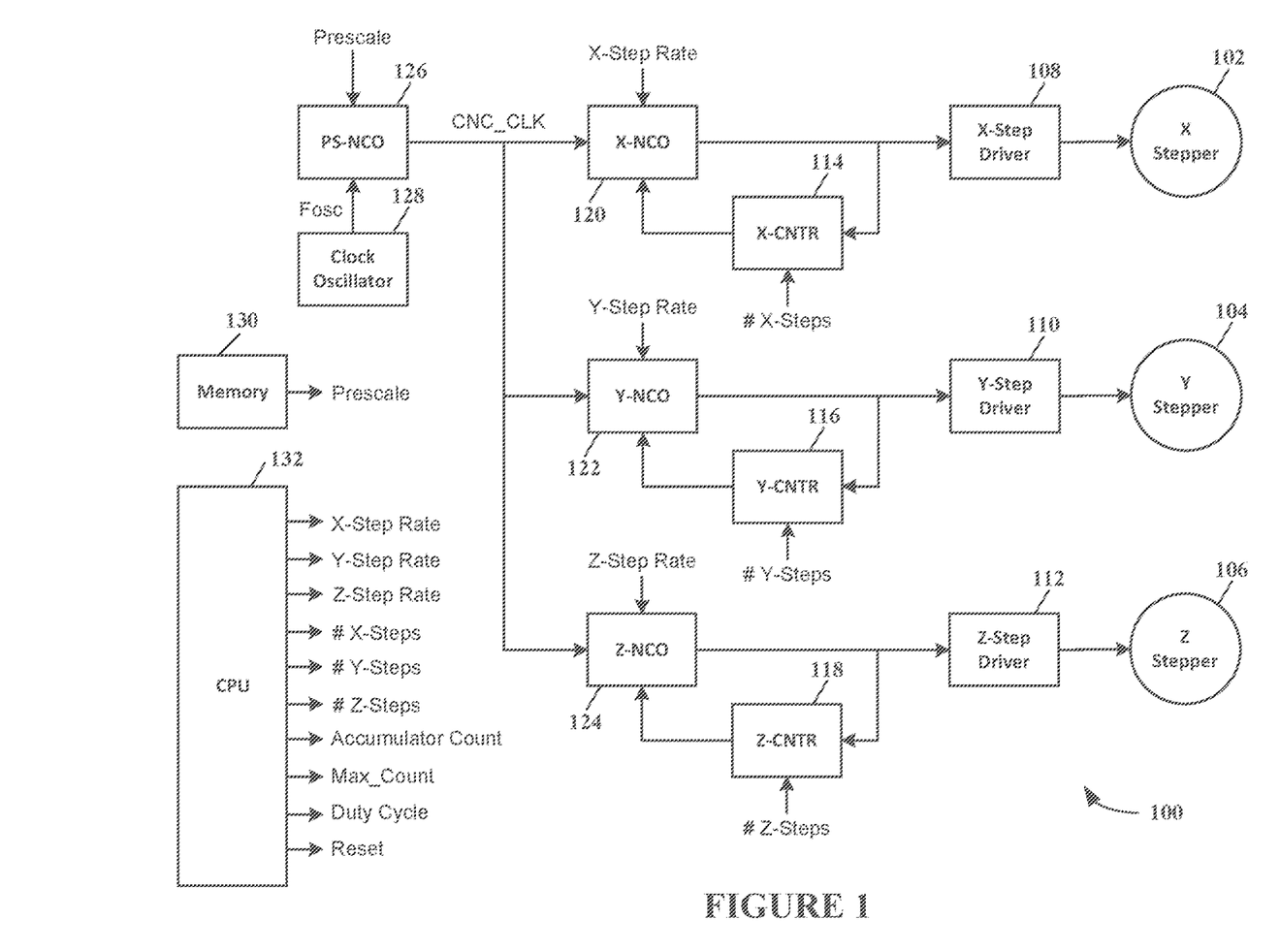
FIG. 1 illustrates a schematic block diagram of a three-axis stepper motor circuit, according to the teachings of this disclosure.

Referring to FIG. 1, depicted is a schematic block diagram of a three-axis stepper motor circuit, according to the teachings of this disclosure. A three axis (x, y and z) stepper motor circuit, generally represented by the numeral 100, CPU 132 and memory 130 are shown, but the disclosure below also applies to two axis and single axis stepper motor circuits.

An NCO 126 may be used as a frequency prescaler and receives a clock signal having a frequency, Fosc, from a clock oscillator 128 and a Prescale value, and provides a CNC_CLK signal having a frequency that is a function of the clock signal, Fosc, and the Prescale value. The NCO 126 may be programmed with the Prescale value stored in a memory 130. The frequency of the signal CNC_CLK may be the frequency, Fosc, from the clock oscillator 128 divided by the Prescale value.

X-stepper motor 102 is driven by an X-step driver 108 at a step rate determined by the frequency of a signal from an X-NCO 120 which is a function of the frequency of the CNC_CLK and an X-step rate programmed into the X-NCO 120, e.g., from the CPU 132. An X-counter 114 may monitor the number of step pulses (frequency cycles) from the X-NCO 120 and inhibit the X-NCO 120 from further output when a programmed count (#X-steps) is reached, e.g., programmed from the CPU 132. The output of the X-NCO 120 may be a function of the frequency of the input signal (CNC_CLK) from the prescaler NCO 126 divided by the X-Step Rate.

Y-stepper motor 104 is driven by a Y-step driver 110 at a step rate determined by the frequency of a signal from a Y-NCO 122 and a Y-step rate programmed into the Y-NCO 122, e.g., from the CPU 132. A Y-counter 116 may monitor the number of step pulses (frequency cycles) from the Y-NCO 122 and inhibit the Y-NCO 122 from further output when a programmed count (#Y-steps) is reached, e.g., programmed from the CPU 132. The output signal frequency from the Y-NCO 122 may be a frequency of an input signal (CNC_CLK) from the prescaler NCO 126 divided by the Y-Step Rate. The NCO 126 receives a clock signal having a frequency, Fosc, from the clock oscillator 128 and outputs a signal with frequency CNC_CLK as describe hereinabove.

Z-stepper motor 106 is driven by a Z-step driver 112 at a step rate determined by the frequency of a signal from a Z-NCO 124 and a Z-step rate programmed into the Z-NCO 124, e.g., from the CPU 132. A Z-counter 118 may monitor the number of step pulses (frequency cycles) from the Z-NCO 124 and inhibit the Z-NCO 124 from further output when a programmed count (#Z-steps) is reached, e.g., programmed from the CPU 132. The output signal frequency from the Y-NCO 122 may be a frequency of an input signal (CNC_CLK) from the prescaler NCO 126 divided by the Y-Step Rate. The NCO 126 receives a clock signal having a frequency, Fosc, from the clock oscillator 128 and outputs a signal with frequency CNC_CLK as describe hereinabove.

A 45-degree angle movement will result when the step rates are the same for the X and Y stepper motors 102 and 104. A different angle movement will result when the X and Y step rates are different. The number of step pulses will determine how far the CNC machine will move when controlled by the stepper motor(s). Thus, keeping track of the number of step pulses from the X-NCO will determine the movement location of the tool controlled by the X-stepper motor 102, likewise for the Y and Z-stepper motors 104 and 106.

The Y-stepper and Z-stepper portions of the three-axis stepper circuit work in substantially the same way as described above for the X-stepper. By programming unique X, Y and Z step rates into the X-NCO 120, Y-NCO 122 and Z-NCO 124, respectively, movement of the CNC tool may be programmed to produce any pattern desired. In addition, the X-step counter (X-CNTR) 114, the Y-step counter (Y-CNTR) 116, and the Z-step counter (Z-CNTR) 118, may be programmed with the maximum number of steps allowed for the X-stepper motor 102, Y-stepper motor 104, and Z-stepper motor 106, respectively, e.g., predetermined counts #X-Steps, #Y-Steps, #Z-Steps. If the maximum number of steps is reached then the step counter(s) (114, 116, 118) may inhibit step output from the respective NCO (120, 122, 124).

Figure 2:
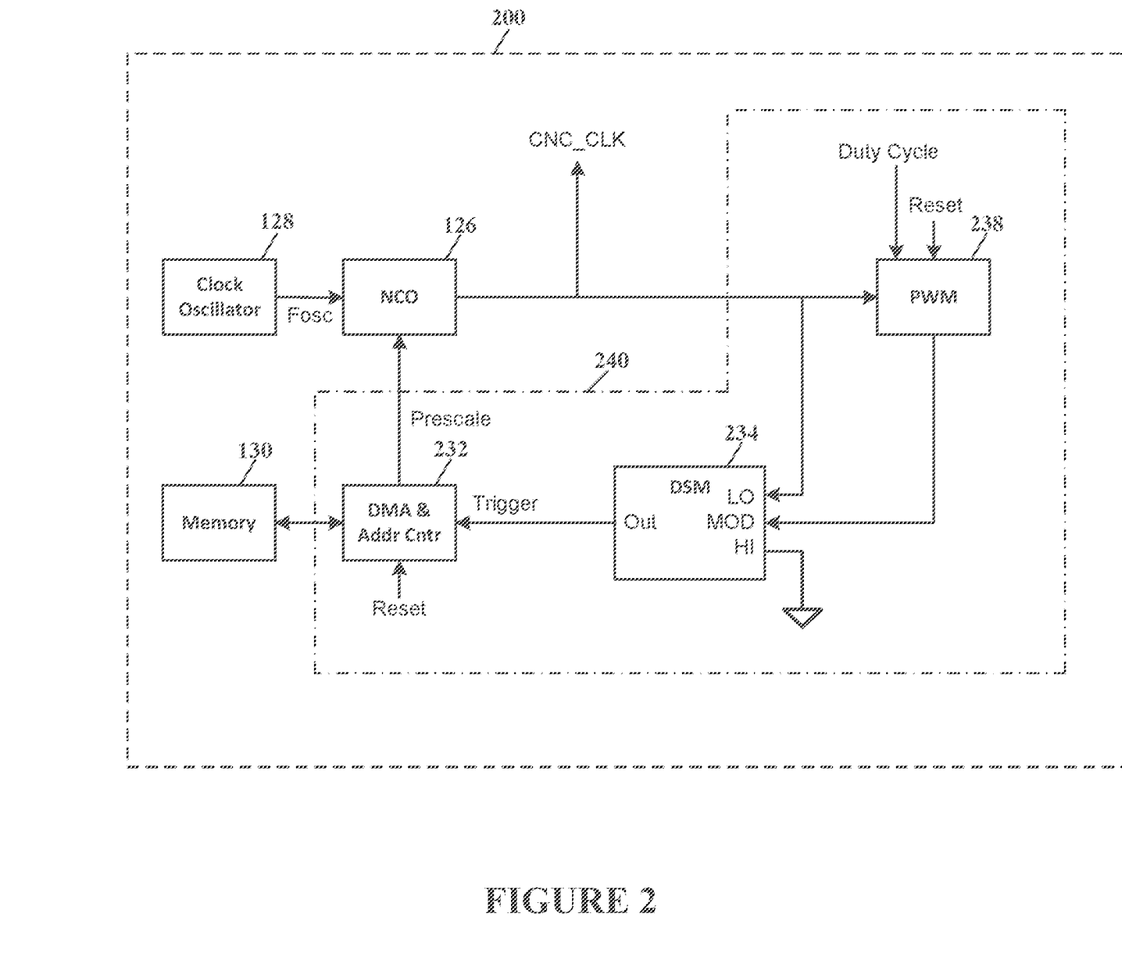
FIGS. 2, 3 and 4 illustrate schematic block diagrams of automated speed ramp control circuits using direct memory access (DMA) transfers to load speed ramp control values for acceleration and deceleration of stepper motors, according to specific example embodiments of this disclosure.

Referring to FIG. 2, depicted is a schematic block diagram of an automated speed ramp control circuit using direct memory access (DMA) transfers to load speed ramp control values for acceleration and deceleration of stepper motors, according to a specific example embodiment of this disclosure. A numerically controlled oscillator (NCO) 126 is configured as a frequency prescaler with a clock input coupled to a clock signal having a frequency, Fosc, supplied from, for example but is not limited to, a clock oscillator 128, a prescale input coupled to a DMA control circuit 240, and an output supplying a CNC_CLK signal having a frequency responsive to an input divisor value Prescale, for example, the frequency of signal CNC_CLK is the frequency Fosc divided by the Prescale value.

The NCO 126 will generate clock pulses, CNC_CLK, having a frequency that is a function of the frequency Fosc divided by the Prescale value. The Prescale value may be programmed into the NCO 126 by the DMA control circuit 240. The DMA control circuit 240 may comprise a direct memory access (DMA) module 232, a data signal modulator (DSM) 234, and a pulse width modulator (PWM) module 238. The DMA module 232 may obtain the Prescale values from a memory 130. The memory 130 stores the Prescale values for both acceleration and deceleration of the stepper motor(s). The DMA module 232, may be for example but is not limited to a CIP, that may function independently from the CPU 132. Upon a reset to the DMA module 232, e.g., from the CPU 132, its address counter may be reset, a first Prescale value is obtained from the memory 130 and programmed into the NCO 126. This starts the NCO 126 which generates the clock pulses (CNC_CLK) at a frequency determined by the frequency, Fosc, from the clock oscillator 128 divided by the Prescale value programmed into the NCO 126.

The PWM module 238 (upon being reset) also starts at a first output (for explanation purposes a logic low) which is received at a MOD input of the DSM 234. A logic low at the MOD input of the DSM 234 couples the CNC_CLK clock pulses to a trigger input of the DMA module 232. Each time a CNC_CLK clock pulse is received, the address counter in the DMA module 232 will increment and the DMA module 232 will read a new Prescale valve from the memory 130 and transfer that new Prescale value into the NCO 126 (DMA transfer). After a certain number of CNC_CLK clock pulses have been received by the PWM module 238 its output will go to a second logic level (for explanation purposes a logic high) and the output of the DSM 234 may be decoupled from the CNC_CLK clock pulses and held at a logic low, whereby no DMA transfers will occur. After a further number of CNC_CLK clock pulses have been received by the PWM module 238 its output will go back to the first logic level, then the CNC_CLK clock pulses will again be coupled to the trigger input (address counter) of the DMA module 232 and DMA transfers to the prescaler NCO 126 will resume for the deceleration phase of the stepper motor speed profile. A PWM duty cycle for the PWM module 238 may be programmed from the CPU 132 by a Duty Cycle signal for any desired ratio of first and second logic levels based upon the number of CNC_CLK clock pulses to be received. The aforementioned circuit and functions may be provided by a microcontroller 200.

The DSM 234 may be configured to switch on the edge of the modulated signal. This prevents shortened pulses due to asynchronous timing between the modulation signal (output from the PWM module 238) and the modulated signal (CNC_CLK).

Figure 3:
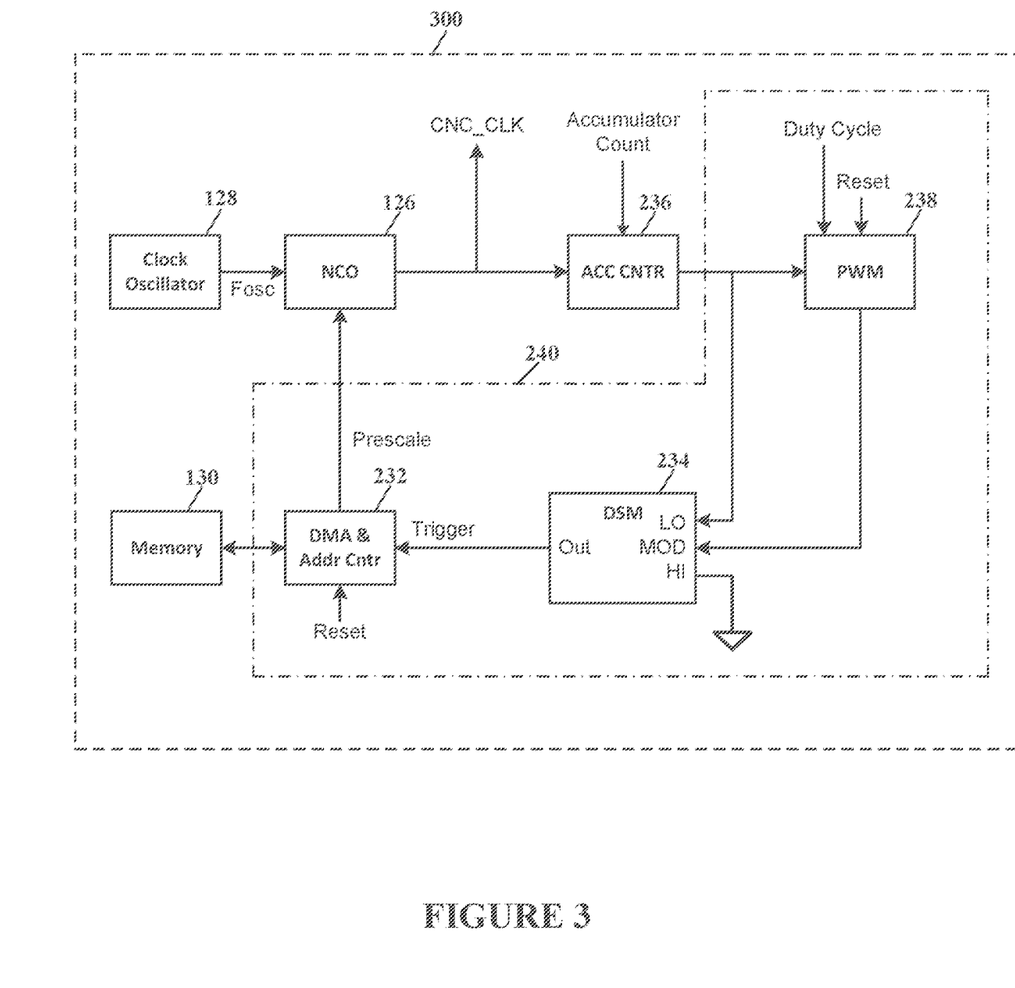

Referring to FIG. 3, depicted is a schematic block diagram of an automated speed ramp control circuit using direct memory access (DMA) transfers to load speed ramp control values for acceleration and deceleration of stepper motors, according to another specific example embodiment of this disclosure. The circuit shown in FIG. 3 functions in substantially the same way as the circuit shown in FIG. 2 and described hereinabove, with the addition of an accumulator counter 236 coupled between the output of the NCO 126 and the inputs of the PWM 238 and DSM 234 modules. The accumulator counter 236 allows a certain number of CNC_CLK pulses to occur before the next DMA transfer is initiated by the DMA module 232. For example, a plurality of CNC_CLK clock pulses would occur before the next DMA transfer was initiated, responsive to an Accumulator Count Load input received from the CPU 132. The aforementioned circuit and functions may be provided by a microcontroller 300.

Figure 4:
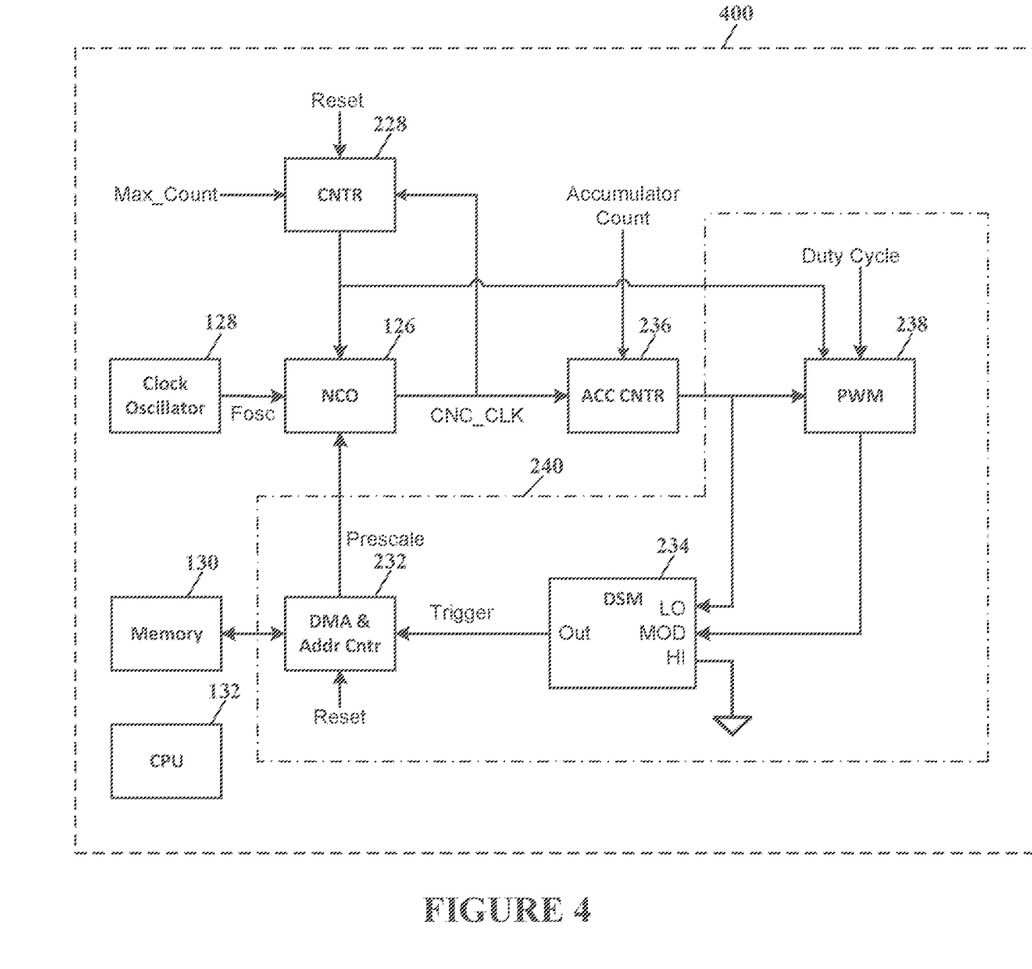

Referring to FIG. 4, depicted is a schematic block diagram of an automated speed ramp control circuit using direct memory access (DMA) transfers to load speed ramp control values for acceleration and deceleration of stepper motors, according to yet another specific example embodiment of this disclosure. The circuit shown in FIG. 4 functions in substantially the same way as the circuits shown in FIGS. 2 and 3, and described hereinabove, with the addition of a counter 228. The counter 228 may be programmed with a maximum count, Max_Count, received from the CPU 132, that causes the prescaler NCO 126 to be inhibited from outputting further CNC_CLK clock pulses when the programmed maximum count is reached. It may also be used to reset the PWM module 238. This may prevent the CNC tool from exceeding a maximum travel distance. The counter 228 may be reset by the CPU 132 upon the start of a new acceleration/deceleration profile. The aforementioned circuit and functions may be provided by a microcontroller 400.

Figure 5:
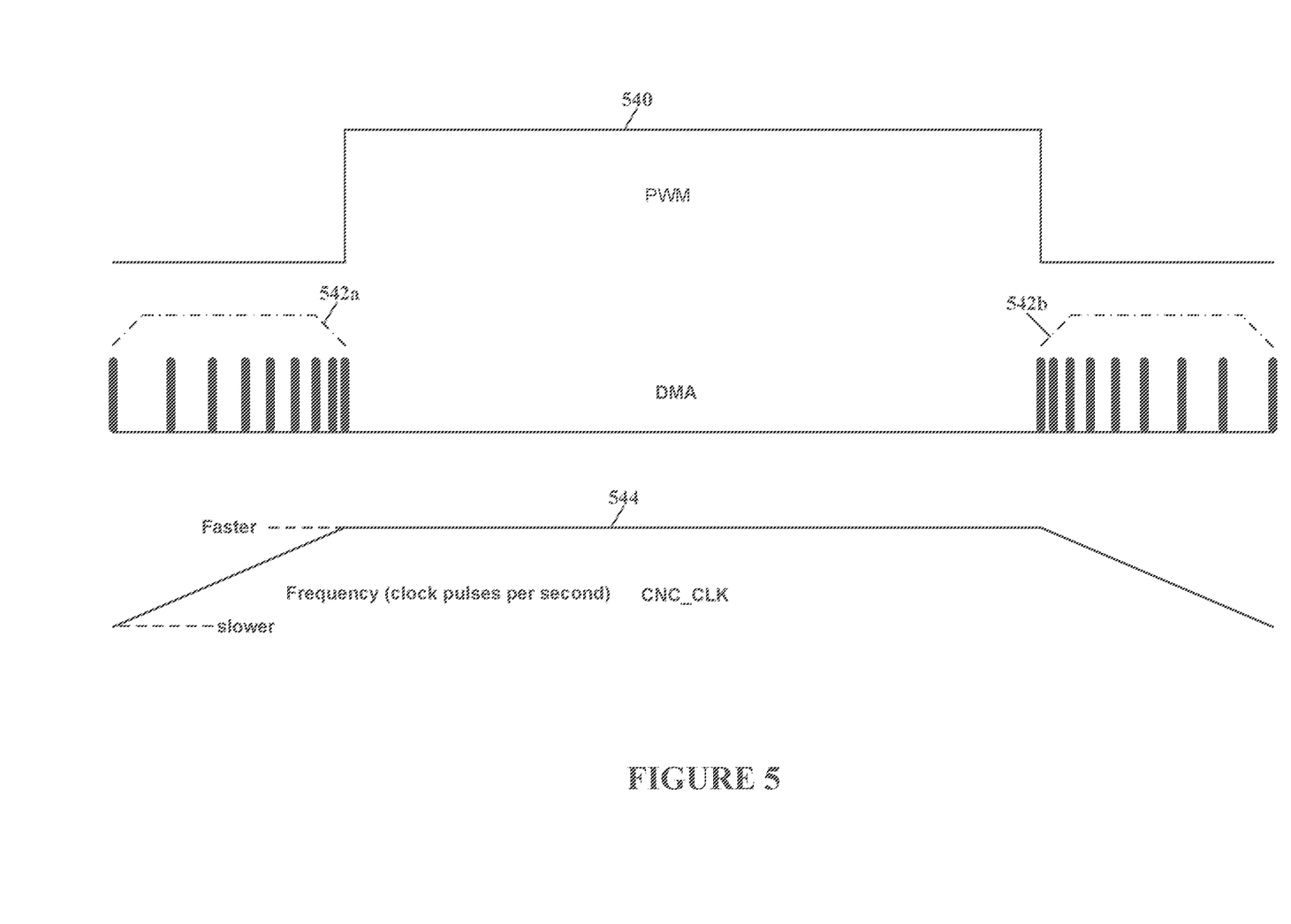
FIG. 5 illustrates schematic graphs of the operation of the automated speed ramp control circuits shown in FIGS. 2, 3 and 4.

Referring to FIG. 5, depicted are schematic graphs of the operation of the automated stepper motor acceleration and deceleration circuits shown in FIGS. 2, 3 and 4. An output waveform 540 from the PWM module 238 is shown in relation to the DMA transfers 542 (acceleration DMA transfers 542*a* and deceleration DMA transfers 542*b*) and relative frequency of the CNC_CLK clock pulses 544. Initially, when the output 540 is at the first logic level acceleration DMA transfers 542*a* are allowed, and when the output 540 is at the second logic level there are no DMA transfers 542 (DMA initiation triggers to the DMA module 232 are inhibited). The frequency of the CNC_CLK clock pulses is determined by the NCO 126 based on the Prescale values from the acceleration/deceleration table stored in the memory 230 and programmed into the NCO 126 during each DMA transfer 542. Once the programmed Prescale value providing the highest frequency of CNC_CLK clock pulses is reached, e.g., based upon the number of acceleration DMA transfers 542*a* desired, further DMA transfers are inhibited until a further number of clock pulses (CNC_CLK) occur, then the NCO 126 is again programmed with Prescale value deceleration DMA transfers 542*b* to reduce the frequency of the CNC_CLK clock pulses for deceleration of the stepper motor(s).

Figure 6:
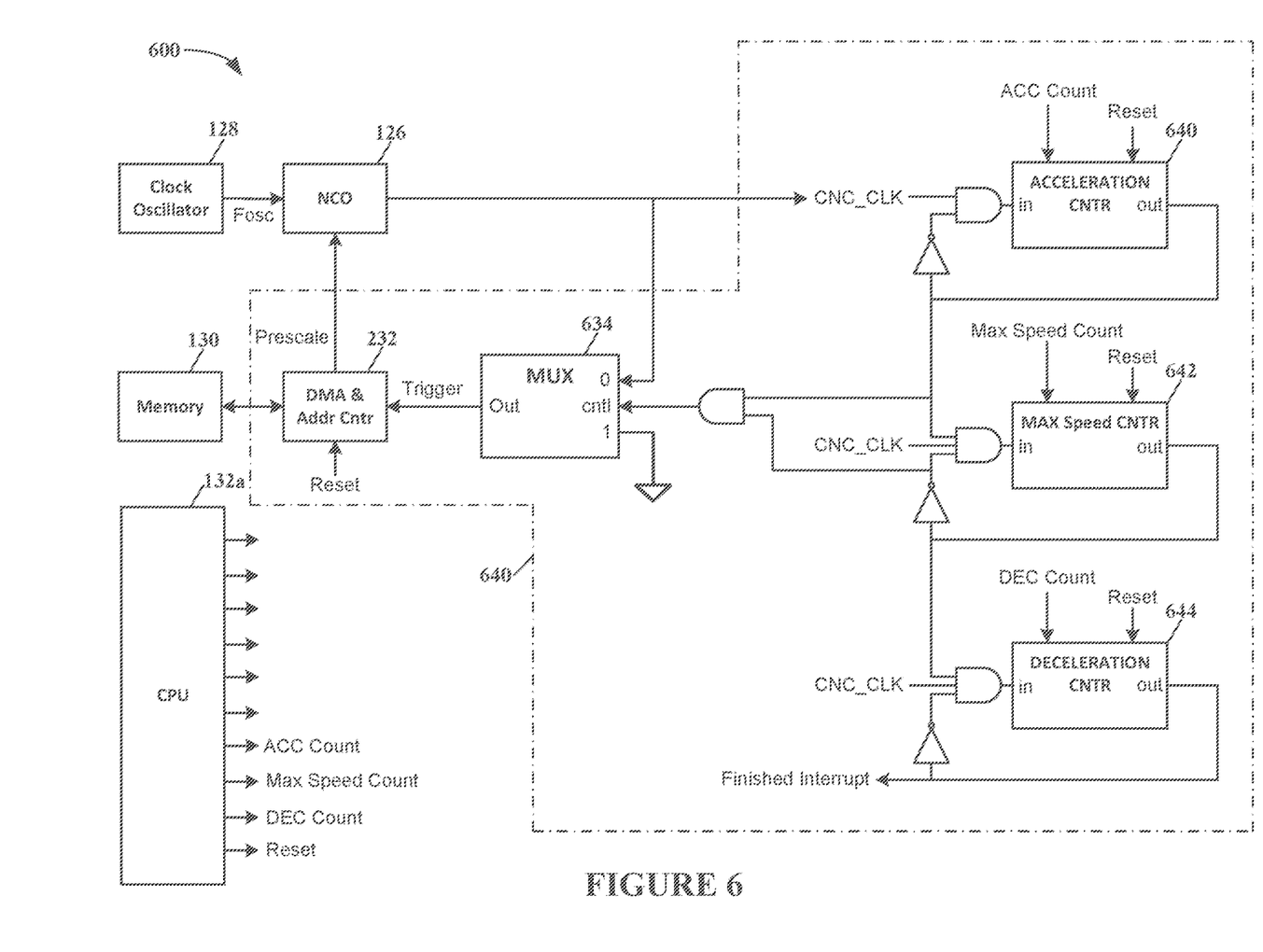
FIG. 6 illustrates a schematic block diagram of functional circuit variations of the automated speed ramp control circuits shown in FIGS. 2, 3 and 4.

It is contemplated and within the scope of this disclosure that the function of the DSM module 234 may be provided by a multiplexer or other combination of logic functions known to one of ordinary skill in the art of digital electronics design and having the benefit of this disclosure. It is also contemplated and within the scope of this disclosure that counters and combinatorial logic may be used in place of the PWM module 238. Referring to FIG. 6, depicted is a schematic block diagram of functional circuit variations of the circuit shown in FIGS. 2, 3 and 4. For example, but not limited to, a DMA control circuit 640 may comprise a DMA module 232, a multiplexer 634, an acceleration counter 640, a maximum speed counter 642, a deceleration counter 644, an associated logic gates (not numbered).

The multiplexer 634 may be used in place of the DSM module 234 wherein a logic "0" at the cntl input will couple the CNC_CLK clock pulses to the trigger input of the DMA module 232, and a logic "1" will inhibit the CNC_CLK clock pulses thereto. An acceleration counter 640 may count the number of CNC_CLK clock pulses during acceleration of the stepper motor(s), a maximum speed counter 642 may count the number of CNC_CLK clock pulses during maximum speed of the stepper motor(s), and a deceleration counter 644 may count the number of CNC_CLK clock pulses during deceleration of the stepper motor(s). Using combinatorial logic, the outputs of counters 640 and 642 may control input selection to the multiplexer 634. Counter 644 may provide an interrupt to the CPU 132a when deceleration of the stepper motors has finished. The aforementioned circuit and functions may be provided by a microcontroller 600.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed is:

1. A method for speed ramp control of a stepper motor using direct memory access (DMA) transfers, said method comprising the steps of:
   providing a central processing unit (CPU) coupled with a memory;
   providing a direct memory access (DMA) control circuit coupled with the memory;
   providing a numerically controlled oscillator (NCO) having oscillator and prescale value inputs and an output providing clock pulses, wherein a frequency of the clock pulses is a function of a frequency of the oscillator input and the prescale value input;
   providing a table of acceleration and deceleration prescale values in the memory;
   programming the NCO with the acceleration prescale values from the memory using DMA transfers performed by the DMA-control circuit for a first number of clock pulses without requiring intervention or program execution by the CPU;
   inhibiting DMA transfers by the DMA-control circuit to the NCO for a second number of clock pulses; and
   programming the NCO with the deceleration prescale values from the memory using DMA transfers by the DMA-control circuit for a third number of clock pulses without requiring intervention or program execution by the CPU.

2. The method according to claim 1, further comprising the step of counting a certain number of clock pulses from the NCO before doing the DMA transfer for the first number of clock pulses to the NCO.

3. The method according to claim 1, further comprising the step of counting the number of clock pulses from the NCO then inhibiting the output of the NCO after the number of clock pulses reaches a maximum count.

4. An apparatus for automated speed ramp control of stepper motor acceleration and deceleration, comprising:
   an oscillator having an output;
   a numerically controlled oscillator (NCO) having oscillator and prescale value inputs and an output providing clock pulses, wherein the NCO oscillator input is coupled to the oscillator output and a frequency of the clock pulses from the NCO is a function of a frequency from the oscillator and the prescale value input;
   a central processing unit (CPU);
   a memory coupled with the CPU and for storing a plurality of acceleration and deceleration prescale values; and
   a direct memory access (DMA) control circuit coupled between the NCO prescale value input and the memory, and coupled to the output of the NCO, wherein the DMA control circuit provides the NCO at the prescale value input with acceleration prescale values from the memory for a first number of clock pulses without requiring intervention or program execution by the CPU, thereafter the DMA control circuit is inhibited for a second number of clock pulses, and then the DMA control circuit provides the NCO at the prescale value input with deceleration prescale values from the memory for a third number of clock pulses without requiring intervention or program execution by the CPU.

5. The apparatus according to claim 4, further comprising an accumulator counter coupled between the output of the NCO and the DMA control circuit, wherein the DMA control circuit provides a single prescale value to the NCO after a certain number of clock pulses have occurred.

6. The apparatus according to claim 4, further comprising a counter coupled to the output of the NCO and inhibiting operation of the NCO to output further clock pulses after receiving a certain maximum number of clock pulses therefrom.

7. The apparatus according to claim 4, wherein the DMA control circuit comprises:
   a pulse width modulation (PWM) module having an input coupled to the clock output of the NCO and an output; and
   a data signal modulator (DSM) having a first input coupled to the clock output of the NCO, a second input coupled to a fixed logic level, an output coupled to a DMA trigger input of a DMA module and a control input coupled to the PWM module output for selectively coupling the output of the DSM between the first and second inputs thereof, wherein the first input is selected when the output of the PWM module is at a first logic level and the second input is selected when the output of the PWM module is at a second logic level.

8. The apparatus according to claim 7, further comprising an accumulator counter coupled between the output of the NCO, and the first input of the DSM and the input of the PWM module, wherein the DMA module provides a single prescale value to the NCO after a certain number of clock pulses have occurred responsive to an input to the accumulator counter.

9. The apparatus according to claim 7, wherein a duty cycle of the PWM module is programmable to provide the first logic level output during the first number of clock pulses, the second logic level output during the second number of clock pulses, and the first logic level output during the third number of clock pulses.

10. The apparatus according to claim 7, wherein the first logic level is a logic zero and the second logic level is a logic one.

11. The apparatus according to claim 7, wherein the first logic level is a logic one and the second logic level is a logic zero.

12. The apparatus according to claim 7, wherein the output of the DSM is to switch between the first and second inputs thereof on an edge of a control signal to the control input of the DSM.

13. The apparatus according to claim 4, wherein the DMA control circuit comprises:
- a first counter for counting the first number of clock pulses;
- a second counter for counting the second number of clock pulses;
- a third counter for counting the third number of clock pulses; and
- a multiplexer having a first input coupled to the NCO output, a second input coupled to a fixed logic level, an output coupled to the DMA module and input selection controlled by the first, second and third counters;

wherein
- the first counter controls the multiplexer to couple the first input to the output thereof during the first number of clock pulses,
- the second counter controls the multiplexer to couple the second input to the output thereof during the second number of clock pulses, and
- the third counter controls the multiplexer to couple the first input to the output thereof during the third number of clock pulses.

14. An apparatus for automated speed ramp control of stepper motor acceleration and deceleration, comprising:
- an oscillator having an output;
- a numerically controlled oscillator (NCO) having oscillator and prescale value inputs and an output providing clock pulses, wherein the NCO oscillator input is coupled to the oscillator output and a frequency of the provided clock pulses is a function of a frequency from the oscillator and the prescale value;
- a central processing unit (CPU);
- a memory coupled with the CPU and for storing a plurality of acceleration and deceleration prescale values;
- a direct memory access (DMA) module coupled between the NCO prescale value input and the memory;
- a pulse width modulation (PWM) module having an input coupled to the clock output of the NCO; and
- a data signal modulator (DSM) having a first input coupled to the clock output of the NCO, a second input coupled to a fixed logic level, an output coupled to a DMA trigger input of the DMA module and a control input for selectively coupling the output of the DSM between the first and second inputs thereof;

wherein the DMA module programs the NCO with acceleration prescale values during a first number of clock pulses without requiring intervention or program execution by the CPU, does no programming of the NCO during a second number of clock pulses, and programs the NCO with deceleration prescale values during a third number of clock pulses without requiring intervention or program execution by the CPU.

15. The apparatus according to claim 14, further comprising an accumulator counter coupled between the clock output of the NCO, and the first input of the DSM and the input of the PWM module, wherein the DMA module provides a single prescale value to the NCO after a certain number of clock pulses have occurred.

16. The apparatus according to claim 14, further comprising a counter coupled to the output of the NCO and inhibiting operation of the NCO to output further clock pulses after receiving a certain maximum number of clock pulses therefrom.

17. The apparatus according to claim 14, wherein a duty cycle of the PWM module is programmable to provide the first logic level output during the first number of clock pulses, the second logic level output during the second number of clock pulses, and the first logic level output during the third number of clock pulses.

18. The apparatus according to claim 14, wherein the output of the DSM is configured to switch between the first and second inputs thereof on an edge of a control signal to the control input of the DSM.

\* \* \* \* \*